US008831765B2

(12) United States Patent
Chen et al.

(10) Patent No.: US 8,831,765 B2
(45) Date of Patent: Sep. 9, 2014

(54) METHOD FOR OPERATING AN AUTOMATIC HANDLING SYSTEM APPLIED TO MANY WAFER PROCESSING APPARATUSES

(75) Inventors: Tsan-I Chen, Taoyuan County (TW); Jung-Pin Lai, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 447 days.

(21) Appl. No.: 13/336,258

(22) Filed: Dec. 23, 2011

(65) Prior Publication Data

US 2013/0138237 A1   May 30, 2013

(30) Foreign Application Priority Data

Nov. 25, 2011   (TW) .............................. 100143314 A

(51) Int. Cl.
*G06F 19/00*   (2011.01)
(52) U.S. Cl.
USPC ........................................................ 700/113
(58) Field of Classification Search
None
See application file for complete search history.

(56) References Cited

U.S. PATENT DOCUMENTS

| 2004/0118980 A1* | 6/2004 | Chang et al. ................... 246/1 C |
| 2010/0051422 A1* | 3/2010 | Bonora et al. ................. 198/817 |
| 2010/0074717 A1* | 3/2010 | Huang et al. ............. 414/222.02 |
| 2010/0204826 A1 | 8/2010 | Sawado et al. |

FOREIGN PATENT DOCUMENTS

| TW | 201013820 A | 4/2010 |
| TW | 201029906 A | 8/2010 |

OTHER PUBLICATIONS

Communication From the Taiwan Patent Office Regarding a Counter-Part Foreign Application Dated (Taiwan Year 103) Jun. 24, 2014.

\* cited by examiner

*Primary Examiner* — Sean Shechtman
*Assistant Examiner* — Steven Garland
(74) *Attorney, Agent, or Firm* — Rosenberg, Klein & Lee

(57) ABSTRACT

The instant disclosure provides a method for operating an automatic handling system applied to many wafer processing apparatuses. When a OHT (Overhead Hoist Transport) vehicle is moved to one of the wafer processing apparatuses, the OHT vehicle can ask a OHT control module whether a wafer carrier device can be unloaded from the OHT vehicle onto the wafer processing apparatus. There are two judgment methods as follows: (1) If there is another wafer carrier device already disposed on the wafer processing apparatus, the OHT control module will inform the OHT vehicle that the wafer carrier device cannot be unloaded from the OHT vehicle onto the wafer processing apparatus; (2) If there is no any wafer carrier device disposed on the wafer processing apparatus, the OHT control module will inform the OHT vehicle that the wafer carrier device can be unloaded from the OHT vehicle onto the wafer processing apparatus.

8 Claims, 9 Drawing Sheets

METHOD FOR OPERATING AN AUTOMATIC HANDLING SYSTEM APPLIED TO MANY WAFER PROCESSING APPARATUSES

BACKGROUND OF THE INVENTION

1. Field of the Invention

The instant disclosure relates to a method for operating an automatic handling system, and more particularly, to a method for operating an automatic handling system that is applied to many wafer processing apparatuses.

2. Description of Related Art

In semiconductor manufacturing, lots of wafers have to be subjected to a fabrication process with multiple steps so as to be manufactured into desired semiconductor devices. In order to obtain profit, all the semiconductor manufacturers wish to reduce the time required for manufacturing lots of wafers, thereby increasing the yield of the semiconductor fabrication plant. There are many factors to influence the time required for manufacturing the wafers. In addition to the time required for manufacturing wafers on the respective fabrication machine tools, the time for transporting the wafers among different fabrication machine tools is also another critical factor.

The traditional transport of wafers is achieved by manpower. In this case, operators push vehicles in which wafers are carried back and forth between different fabrication machine tools. However, with the continuous advancement of the semiconductor manufacturing process, the size of wafer is increased from 6", 8" to 12". As a result, the size of a wafer carrier for carrying wafers is increased accordingly. For example, a semiconductor plant often utilizes front opened unified pods (FOUP). When a FOUP is loaded with 25 pieces of wafers, the total weight of the wafer carrier is up to 8 kilograms, so that the traditional transport by manpower is not feasible any more. Moreover, taking the yield or other factors into consideration, it is necessary to provide a wafer transport system with high rate and efficiency, whereby the yield of a semiconductor plant can be increased. Therefore, an automatic transport system is developed for this purpose.

A common automatic transport system includes a plurality of overhead transport rail sets. A plurality of sets of fabrication machine tools is provided below each of the overhead transport rail sets. Each of the overhead transport rail sets defines a bay. The fabrication machine tools disposed in the same bay will be closely related to each other. The transport rail sets are provided with a plurality of overhead hoist transport vehicles (OHT vehicles) or called "vehicles" for short. The vehicles move on the overhead transport rail sets, whereby the wafer carrier can be transported from one fabrication machine tool to another fabrication machine tool. Further, each of the overhead transport rail sets is connected with another overhead transport rail set, so that the vehicles can move into different overhead transport rail sets to thereby transport the wafer carrier into the fabrication machine tool of another bay.

SUMMARY OF THE INVENTION

One aspect of the instant disclosure relates to a method for operating an automatic handling system applied to many wafer processing apparatuses.

One of the embodiments of the instant disclosure provides a method for operating an automatic handling system applied to many wafer processing apparatuses, comprising the steps of: providing at least one surrounding handling track, at least one first OHT vehicle for carrying a first wafer carrier device, at least one second OHT vehicle, at least one first wafer processing apparatus, at least one second wafer processing apparatus for receiving a second wafer carrier device, at least one temporary wafer-receiving apparatus for receiving a third wafer carrier device, and a OHT vehicle control module for controlling the first OHT vehicle and the second OHT vehicle to move on the surrounding handling track; simultaneously issuing a first unloading command and a first loading command from a main system control module, for moving the first OHT vehicle to the first wafer processing apparatus and unloading the first wafer carrier device onto the first wafer processing apparatus from the first OHT vehicle; issuing a second loading command and a second unloading command from the main system control module, for moving the first OHT vehicle to the temporary wafer-receiving apparatus and loading the first OHT vehicle with the third wafer carrier device from the temporary wafer-receiving apparatus; moving the first OHT vehicle to the second wafer processing apparatus, for asking the OHT vehicle control module whether the third wafer carrier device can be unloaded onto the second wafer processing apparatus from the first OHT vehicle; informing the first OHT vehicle by the OHT vehicle control module to stop unloading the third wafer carrier device onto the second wafer processing apparatus from the first OHT vehicle; issuing a surrounding command to the first OHT vehicle from the OHT vehicle control module for continuously moving the first OHT vehicle along the surrounding handling track; moving the second OHT vehicle to the second wafer processing apparatus for loading the second OHT vehicle with the second wafer carrier device from the second wafer processing apparatus; moving the first OHT vehicle to reach the second wafer processing apparatus after finishing the surrounding command, for asking the OHT vehicle control module whether the third wafer carrier device can be unloaded onto the second wafer processing apparatus from the first OHT vehicle; informing the first OHT vehicle by the OHT vehicle control module to unloading the third wafer carrier device onto the second wafer processing apparatus from the first OHT vehicle; and unloading the third wafer carrier device onto the second wafer processing apparatus from the first OHT vehicle.

Another one of the embodiments of the instant disclosure provides a method for operating an automatic handling system applied to many wafer processing apparatuses, comprising the steps of: moving a OHT vehicle to one of the wafer processing apparatuses, and then asking a OHT vehicle control module whether a wafer carrier device can be unloaded onto the wafer processing apparatus from the OHT vehicle; wherein when another wafer carrier device has been disposed on the wafer processing apparatus, the OHT vehicle control module informs the OHT vehicle to stop unloading the wafer carrier device onto the wafer processing apparatus from the OHT vehicle; wherein when there is no any wafer carrier device disposed on the wafer processing apparatus, the OHT vehicle control module informs the OHT vehicle to unloading the wafer carrier device onto the wafer processing apparatus from the OHT vehicle.

Therefore, because the design of moving the OHT vehicle to one of the wafer processing apparatuses for asking the OHT vehicle control module whether the wafer carrier device can be unloaded onto the wafer processing apparatus from the OHT vehicle, the instant disclosure can prevent the automatic handling system and the wafer processing apparatuses from being crashed in order to decrease the handling time and increase the handling efficiency and the production capacity.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

Figure 1:
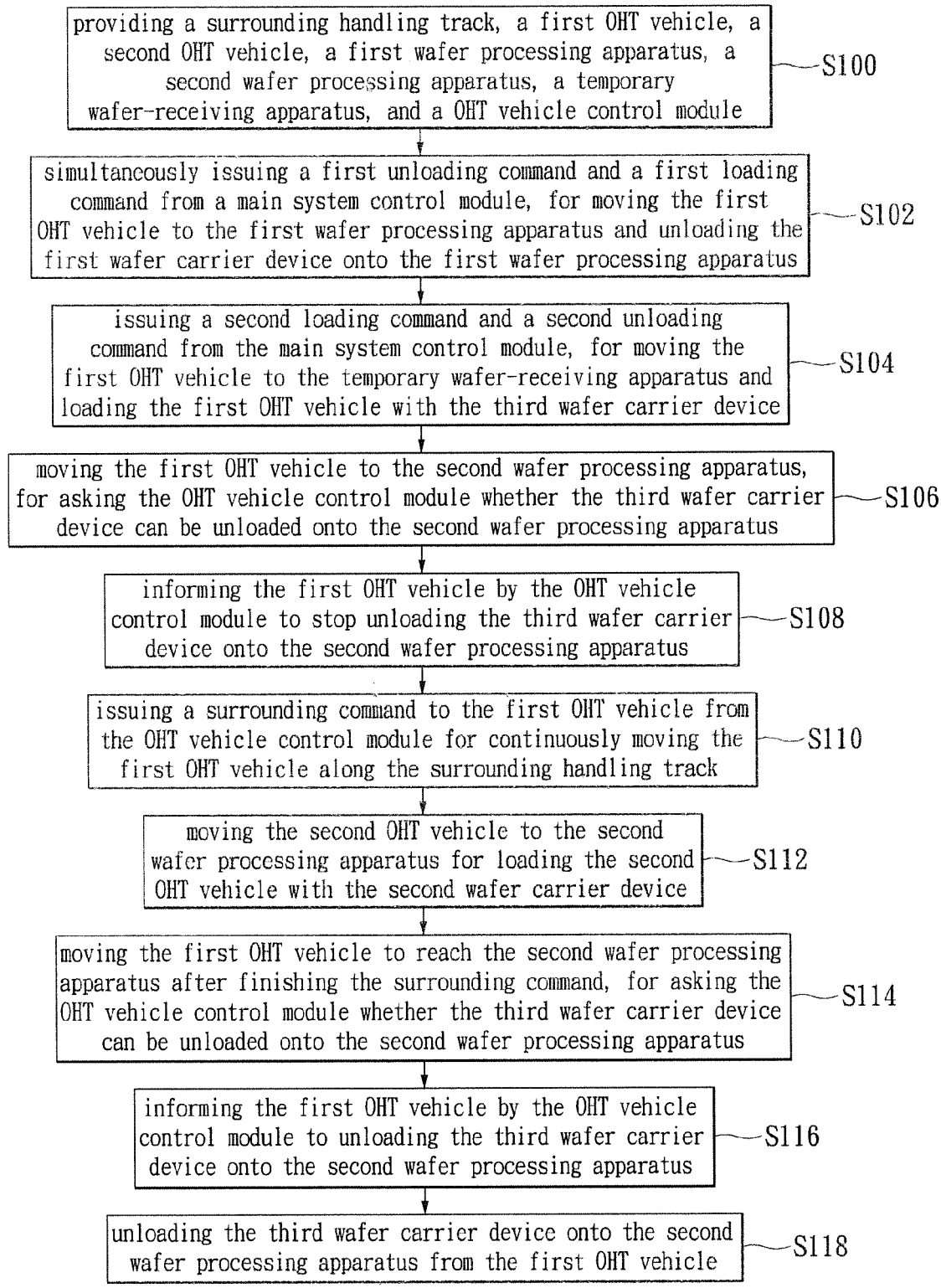
FIG. 1 shows a flowchart of the method for operating an automatic handling system applied to many wafer processing apparatuses according to the instant disclosure.
Figure 2:
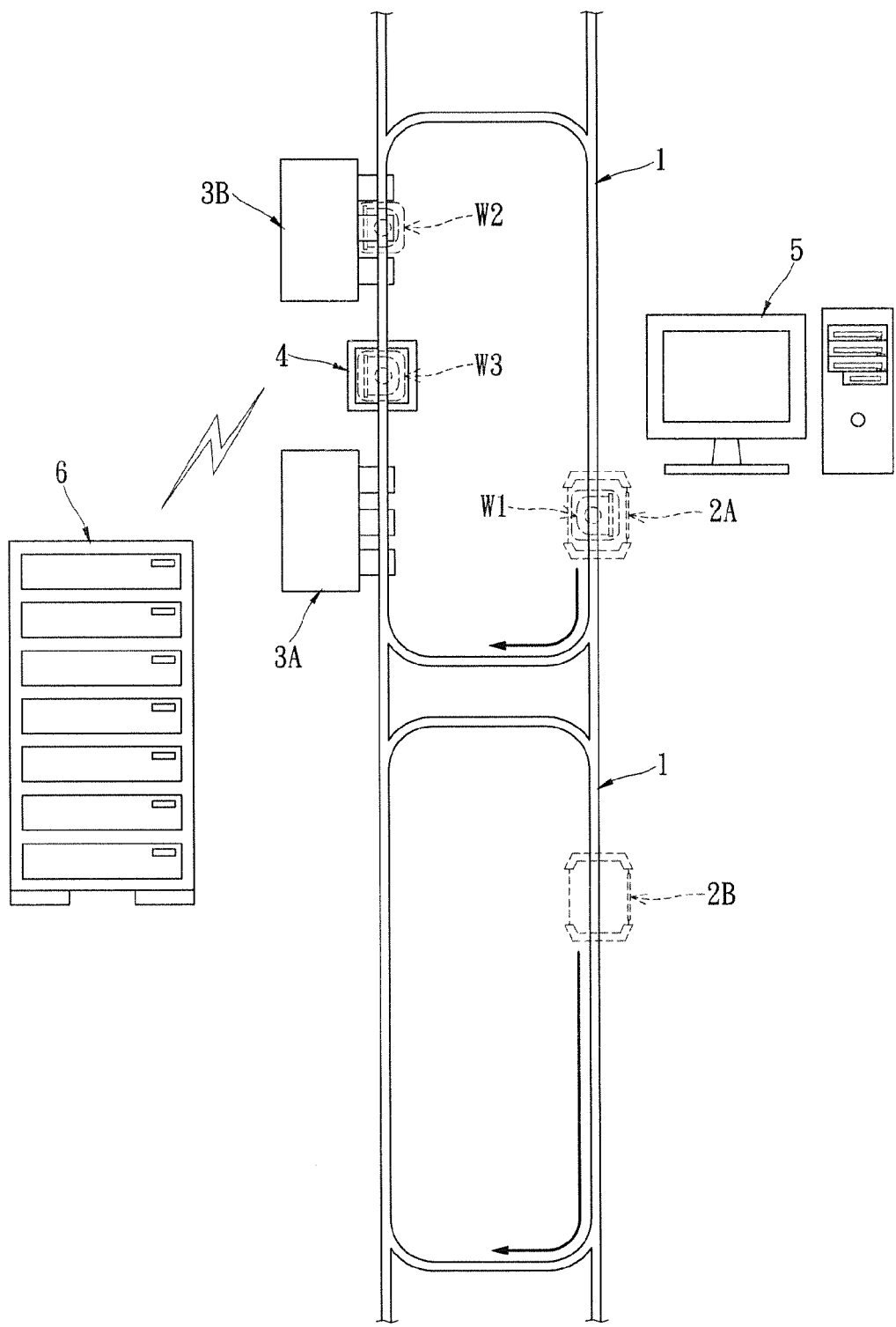
FIG. 2 to FIG. 9 are top, schematic views of the automatic handling system applied to many wafer processing apparatuses according to the instant disclosure, at different stages of the operating processes, respectively.

Referring to FIG. 1 to FIG. 9, where the instant disclosure provides a method for operating an automatic handling system applied to many wafer processing apparatuses, comprising the steps of:

The step S100 is that: referring to FIG. 1 and FIG. 2, providing at least one surrounding handling track 1, at least one first OHT vehicle 2A for carrying a first wafer carrier device W1, at least one second OHT vehicle 2B, at least one first wafer processing apparatus 3A, at least one second wafer processing apparatus 3B for receiving a second wafer carrier device W2, at least one temporary wafer-receiving apparatus 4 for receiving a third wafer carrier device W3, and a OHT vehicle control module 5 for controlling the first OHT vehicle 2A and the second OHT vehicle 213 to move on the surrounding handling track 1.

For example, the instant disclosure can use a plurality of surrounding handling tracks 1 connected with each other, and the first OHT vehicle 2A and the second OHT vehicle 2B can be moved clockwise or anticlockwise. The first OHT vehicle 2A and the second OHT vehicle 2B can be connected to the surrounding handling track 1 and can be slidably disposed under the surrounding handling track 1. The first wafer processing apparatus 3A and the second wafer processing apparatus 3B can be disposed under the surrounding handling track 1. The temporary wafer-receiving apparatus 4 (such as a storage cabinet for temporarily storing wafer) can be disposed under the surrounding handling track 1 and between the first wafer processing apparatus 3A and the second wafer processing apparatus 3B. The OHT vehicle control module 5 may be a computer, server, any electronic device, etc.

Figure 3:
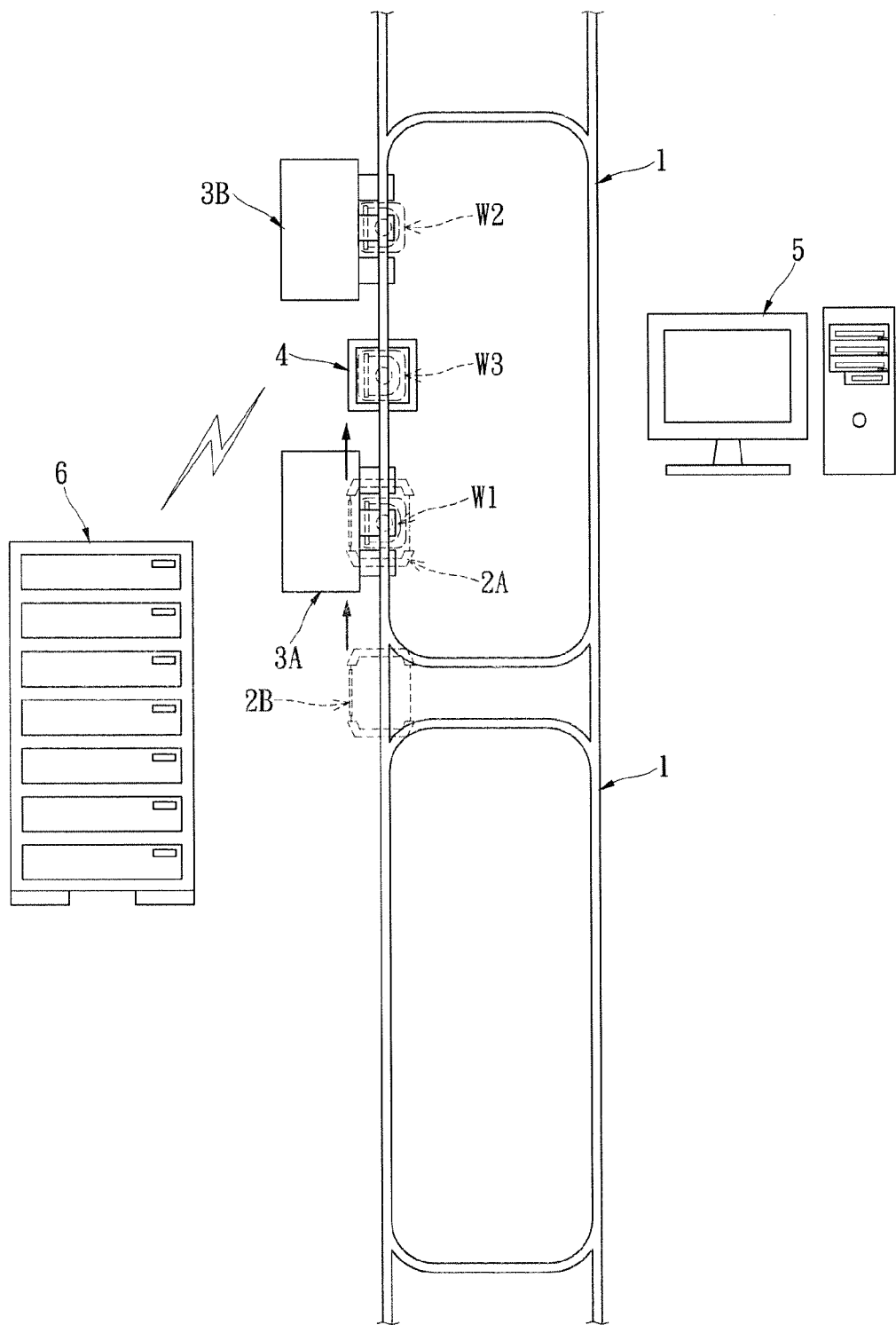

The step S102 is that: referring to FIG. 1, FIG. 2 and FIG. 3, simultaneously issuing (shown as the lightning symbol in FIG. 2) a first unloading command and a first loading command from a main system control module 6 (such as a computer, server, any electronic device, etc.), for moving the first OHT vehicle 2A to the first wafer processing apparatus 3A (as shown in FIG. 3) and unloading the first wafer carrier device W1 onto the first wafer processing apparatus 3A from the first OHT vehicle 2A (as shown in FIG. 3). For example, the first unloading command and the first loading command may be swap commands. In addition, the first unloading command and the first loading command can be simultaneously and respectively transmitted from the main system control module 6 to the first OHT vehicle 2A and the second OHT vehicle 2B, thus when the first OHT vehicle 2A is first moved to the first wafer processing apparatus 3A (as shown in FIG. 3), the first wafer carrier device W1 can be unloaded onto the first wafer processing apparatus 3A from the first OHT vehicle 2A (as shown in FIG. 3).

Figure 4:
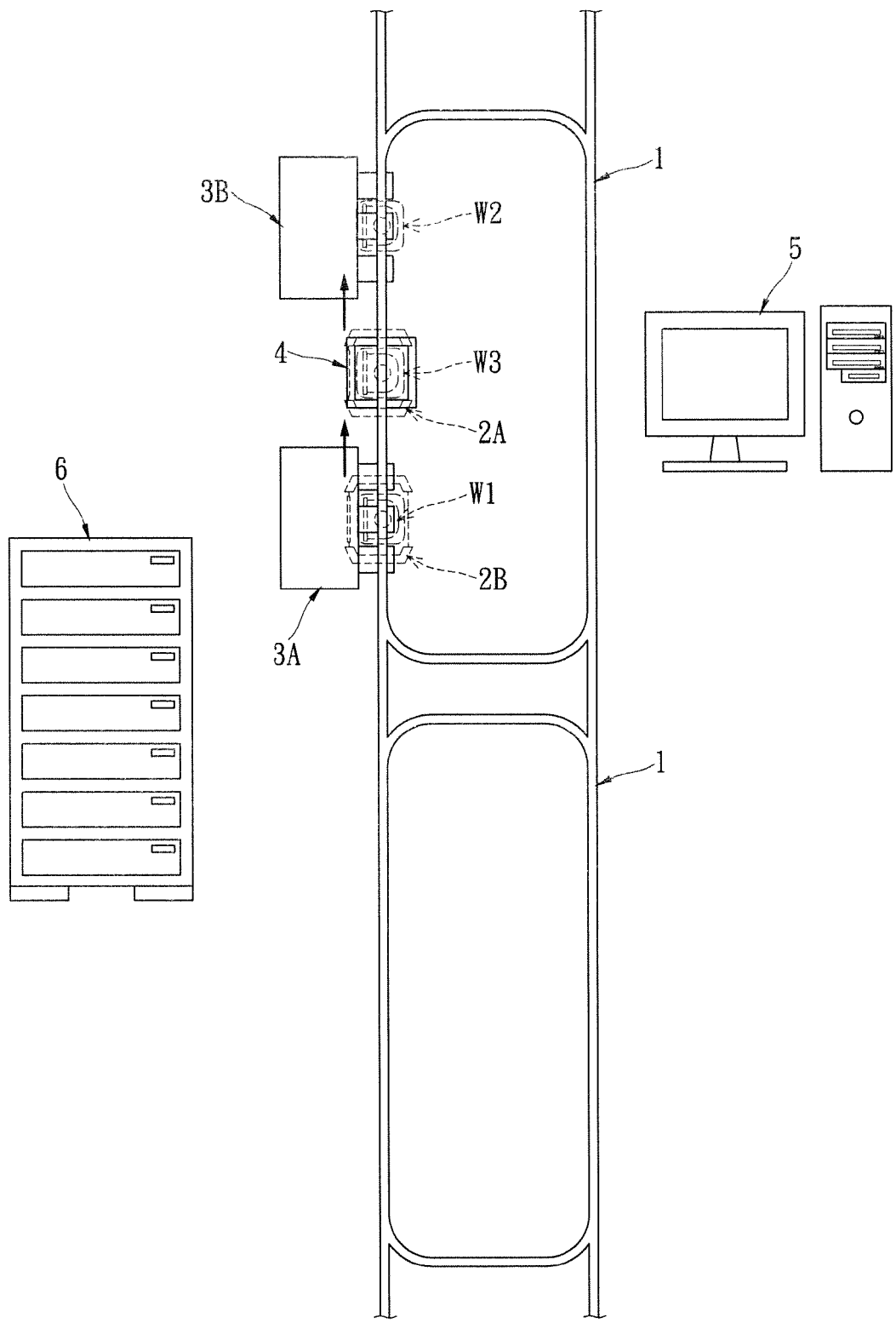

The step S104 is that: referring to FIG. 1, FIG. 3 and FIG. 4, issuing (shown as the lightning symbol in FIG. 3) a second loading command and a second unloading command from the main system control module 6, for moving the first OHT vehicle 2A to the temporary wafer-receiving apparatus 4 (as shown in FIG. 4) and loading the first OHT vehicle 2A with the third wafer carrier device W3 from the temporary wafer-receiving apparatus 4 (as shown in FIG. 4). For example, the second unloading command and the second loading command may be swap commands. In addition, the second loading command and the second unloading command can be transmitted from the main system control module 6 to the first OHT vehicle 2A, thus when the first OHT vehicle 2A is first moved to the temporary wafer-receiving apparatus 4 (as shown in FIG. 4), the third wafer carrier device W3 can be loaded from the temporary wafer-receiving apparatus 4 onto the first OHT vehicle 2A (as shown in FIG. 4).

Figure 5:
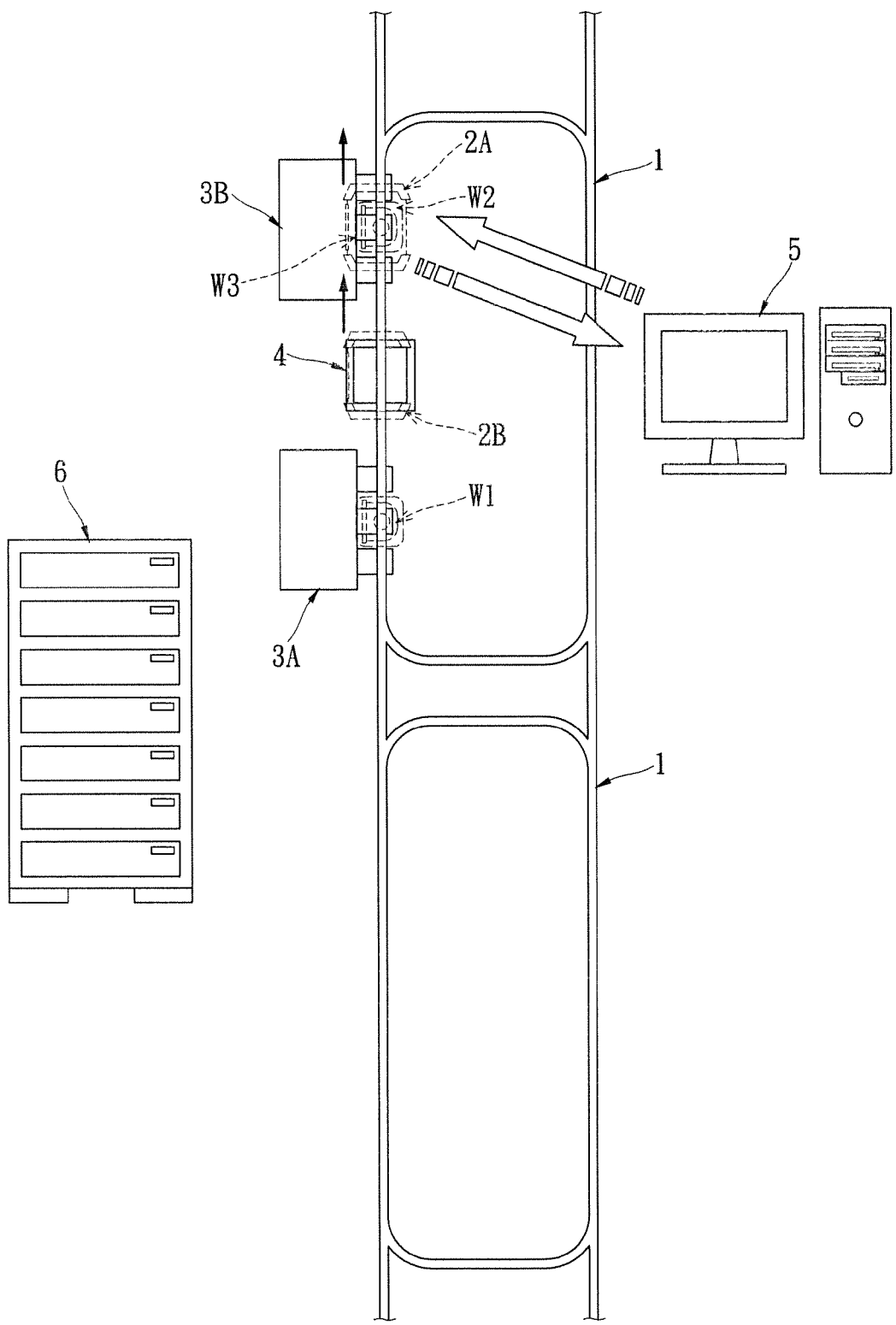

The step S106 is that: referring to FIG. 1, FIG. 4 and FIG. 5, moving the first OHT vehicle 2A to the second wafer processing apparatus 3B, for asking (shown as the arrow from the first OHT vehicle 2A to the OHT vehicle control module 5 in FIG. 5) the OHT vehicle control module 5 whether the third wafer carrier device W3 can be unloaded onto the second wafer processing apparatus 3B from the first OHT vehicle 2A.

The step S108 is that: referring to FIG. 1 and FIG. 5, informing (shown as the arrow from the OHT vehicle control module 5 to the first OHT vehicle 2A in FIG. 5) the first OHT vehicle 2A by the OHT vehicle control module 5 to stop unloading the third wafer carrier device W3 onto the second wafer processing apparatus 3B from the first OHT vehicle 2A. For example, because the second wafer carrier device W2 has been disposed on the second wafer processing apparatus 3B, the OHT vehicle control module 5 cannot allow the third wafer carrier device W3 to unload onto the second wafer processing apparatus 3B from the first OHT vehicle 2A, in order to prevent the automatic handling system and the wafer processing apparatuses from being crashed.

Figure 6:
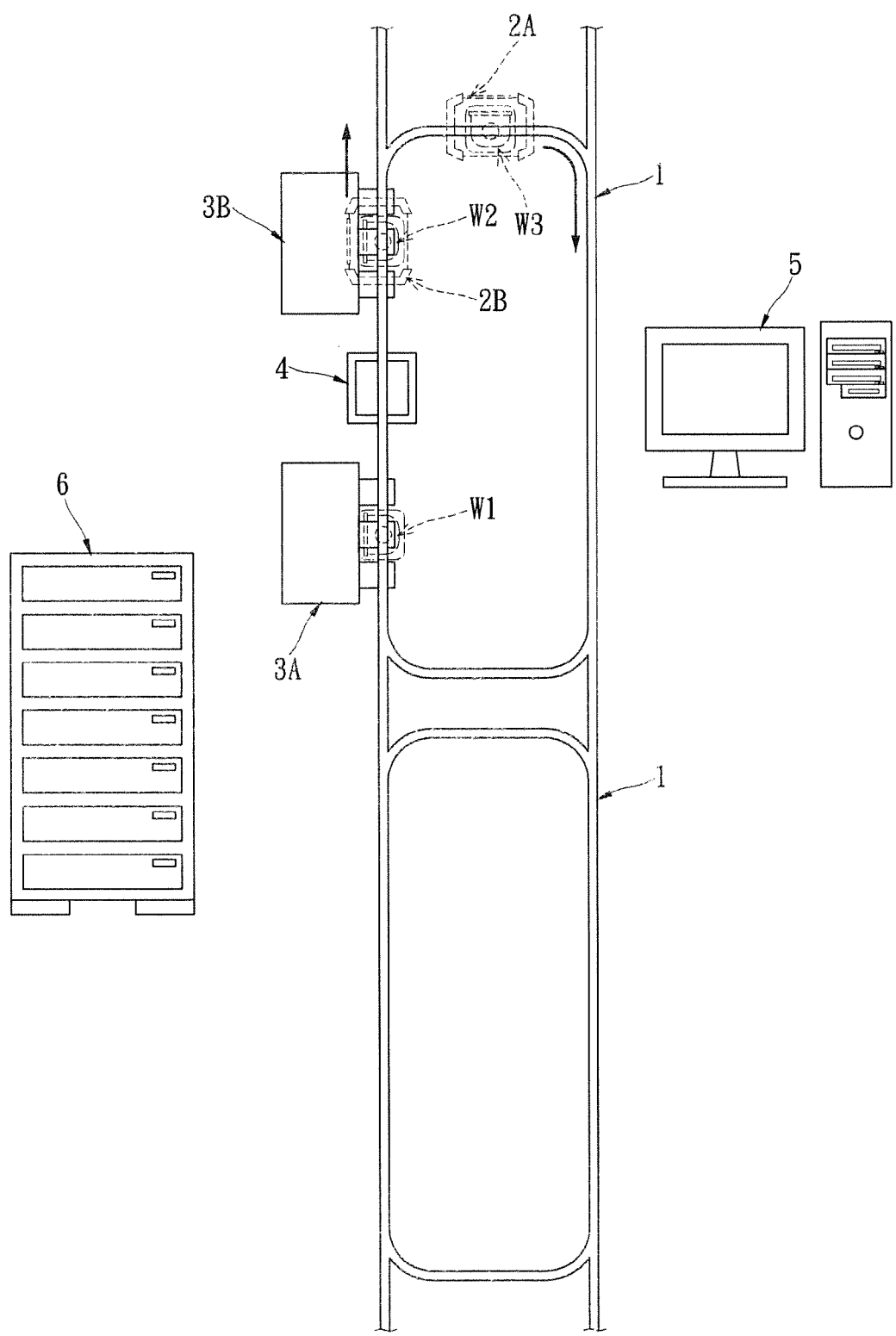

The step S110 is that: referring to FIG. 1, FIG. 5 and FIG. 6, issuing a surrounding command to the first OHT vehicle 2A from the OHT vehicle control module 5 for continuously moving the first OHT vehicle 2A along the surrounding handling track 1. For example, when the surrounding command can be transmitted from the OHT vehicle control module 5 to the first OHT vehicle 2A, the first OHT vehicle 2A can be moved forwardly along the surrounding handling track 1.

Figure 7:
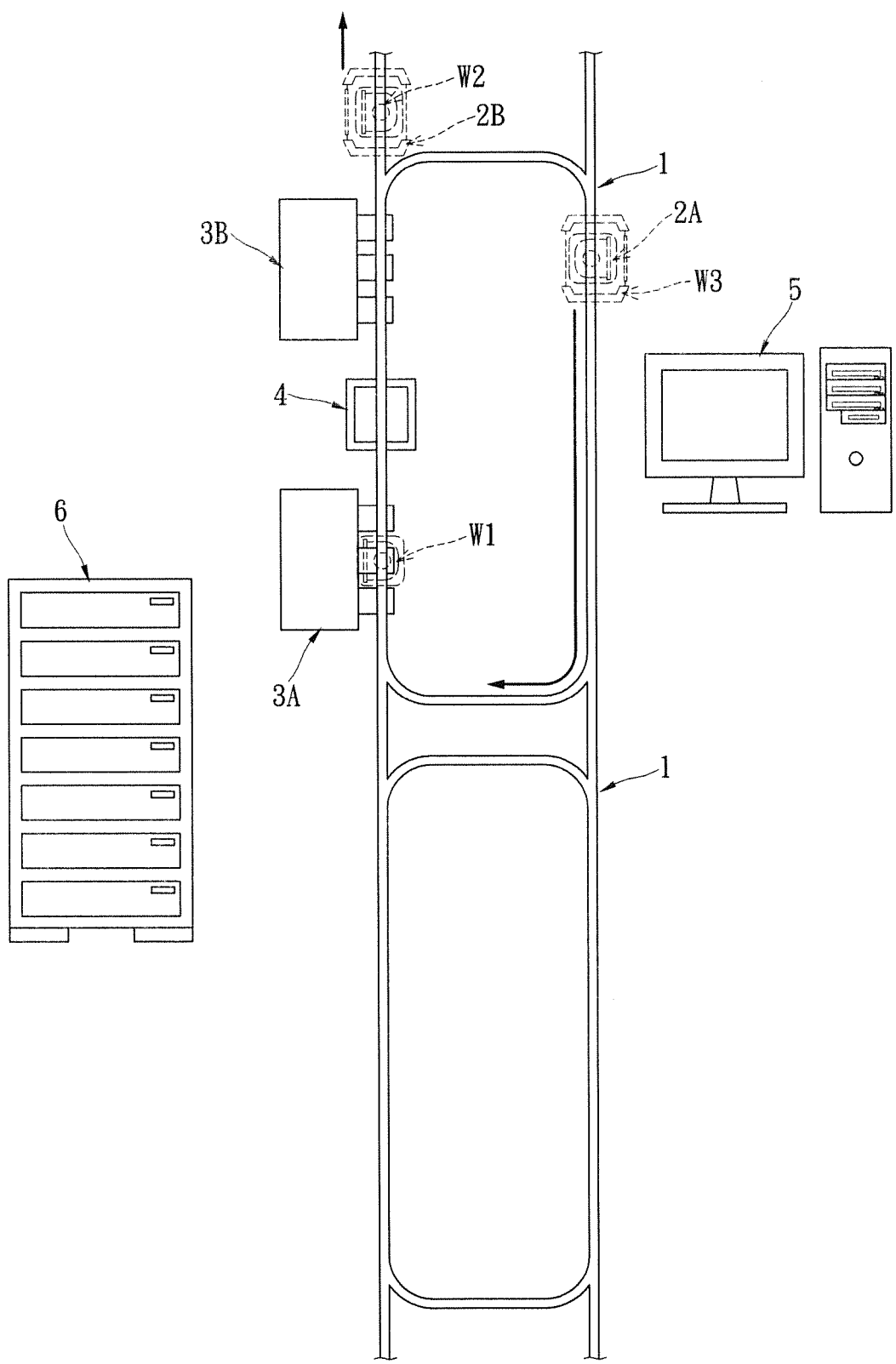

The step S112 is that: referring to FIG. 1, FIG. 6 and FIG. 7, moving the second OHT vehicle 2B to the second wafer processing apparatus 3B for loading the second OHT vehicle 2B with the second wafer carrier device W2 from the second wafer processing apparatus 3B.

Figure 8:
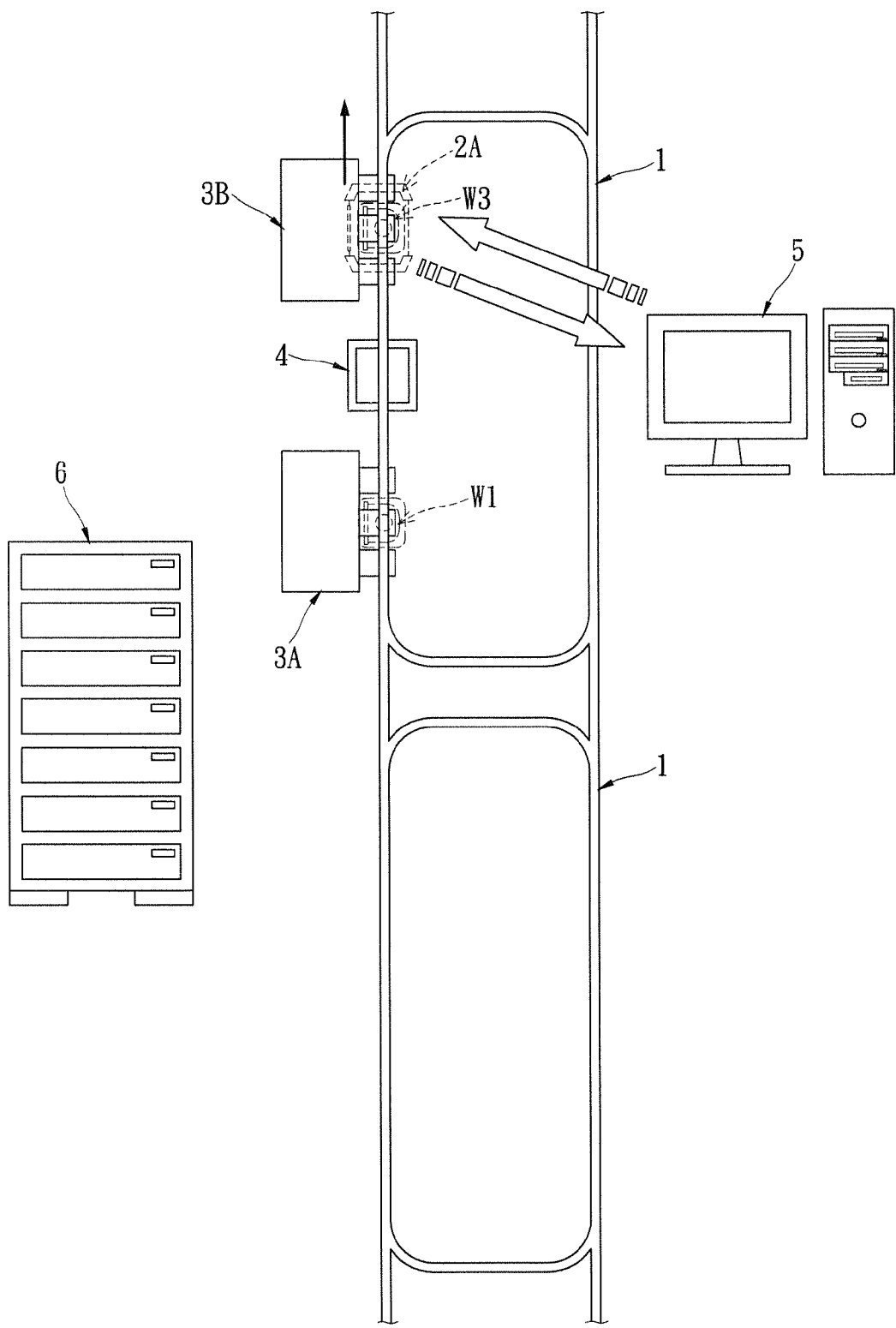

The step S114 is that: referring to FIG. 1, FIG. 7 and FIG. 8, moving the first OHT vehicle 2A to reach the second wafer processing apparatus 3B after finishing the surrounding command, for asking (shown as the arrow from the first OHT vehicle 2A to the OHT vehicle control module 5 in FIG. 8) the OHT vehicle control module 5 whether the third wafer carrier device W3 can be unloaded onto the second wafer processing apparatus 3B from the first OHT vehicle 2A.

The step S116 is that: referring to FIG. 1 and FIG. 8, informing (shown as the arrow from the OHT vehicle control module 5 to the first OHT vehicle 2A in FIG. 8) the first OHT vehicle 2A by the OHT vehicle control module 5 to unloading the third wafer carrier device W3 onto the second wafer processing apparatus 3B from the first OHT vehicle 2A. For example, because there is not any wafer carrier device disposed on the second wafer processing apparatus 3B, the OHT vehicle control module 5 can allow the third wafer carrier device W3 to unload onto the second wafer processing apparatus 3B from the first OHT vehicle 2A.

Figure 9:
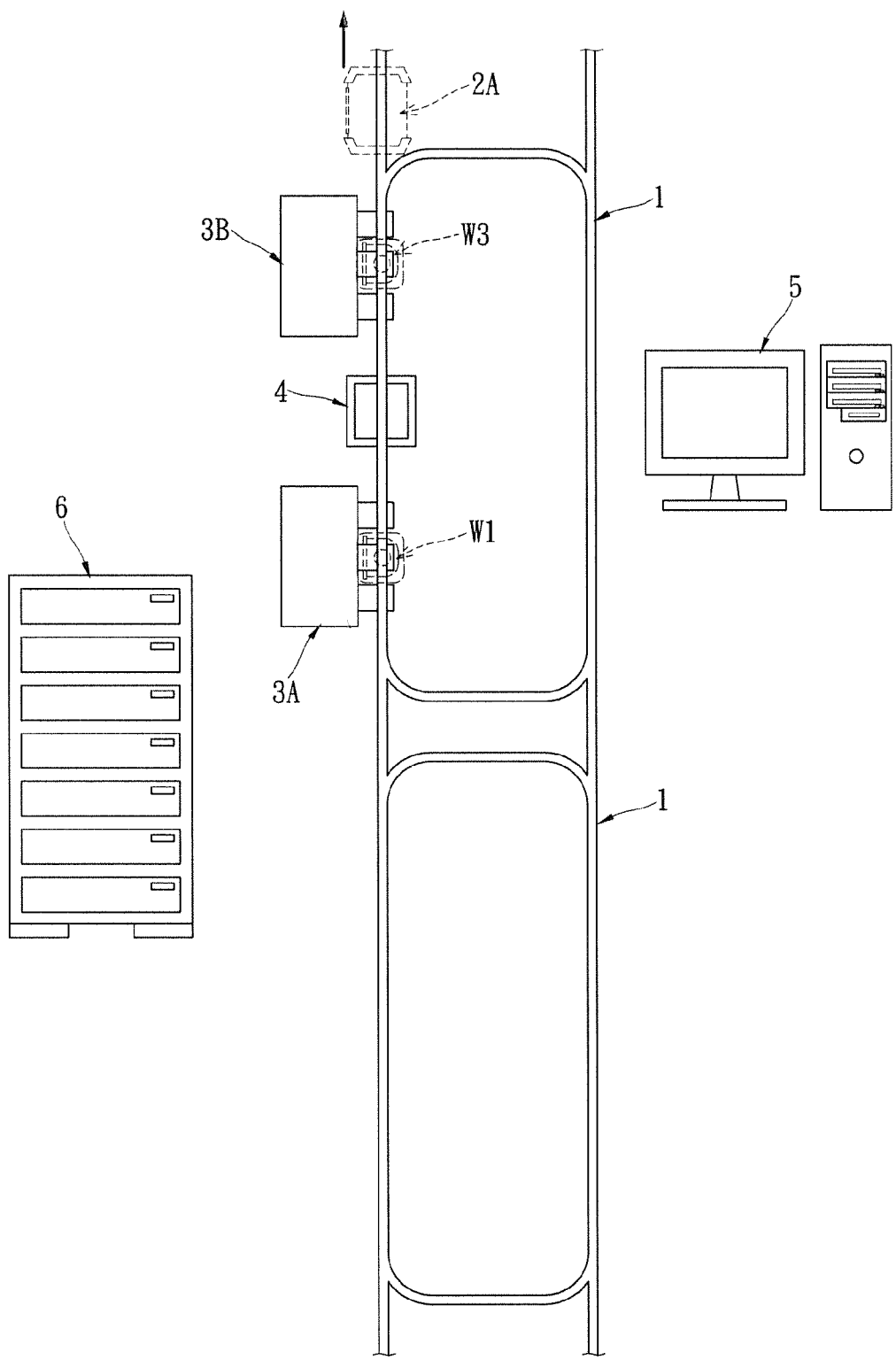

The step S118 is that: referring to FIG. 1, FIG. 8 and FIG. 9, unloading the third wafer carrier device W3 onto the second wafer processing apparatus 3B from the first OHT vehicle 2A.

Therefore, referring to the step S106 to the step S116, when a OHT vehicle is moved to one of the wafer processing apparatuses, the OHT vehicle can ask a OHT control module whether a wafer carrier device can be unloaded from the OHT vehicle onto the wafer processing apparatus. There are two judgment methods as follows: (1) If there is another wafer carrier device already disposed on the wafer processing apparatus, the OHT control module will inform the OHT vehicle that the wafer carrier device cannot be unloaded from the OHT vehicle onto the wafer processing apparatus; (2) If there is no any wafer carrier device disposed on the wafer processing apparatus, the OHT control module will inform the OHT vehicle that the wafer carrier device can be unloaded from the OHT vehicle onto the wafer processing apparatus.

In conclusion, because the design of moving the OHT vehicle to one of the wafer processing apparatuses for asking the OHT vehicle control module whether the wafer carrier device can be unloaded onto the wafer processing apparatus from the OHT vehicle, the instant disclosure can prevent the automatic handling system and the wafer processing apparatuses from being crashed in order to decrease the handling time and increase the handling efficiency and the production capacity.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A method for operating an automatic handling system applied to many wafer processing apparatuses, comprising the steps of:
   providing at least one surrounding handling track, at least one first OHT (Overhead Hoist Transport) vehicle for carrying a first wafer carrier device, at least one second OHT vehicle, at least one first wafer processing apparatus, at least one second wafer processing apparatus for receiving a second wafer carrier device, at least one temporary wafer-receiving apparatus for receiving a third wafer carrier device, and a OHT vehicle control module for controlling the at least one first OHT vehicle and the at least one second OHT vehicle to move on the at least one surrounding handling track;
   simultaneously issuing a first unloading command and a first loading command to the at least one first OHT vehicle and the at least one second OHT vehicle from a main system control module, respectively;
   moving the at least one first OHT vehicle to the at least one first wafer processing apparatus for unloading the first wafer carrier device onto the at least one first wafer processing apparatus from the at least one first OHT vehicle;
   issuing a second loading command and a second unloading command to the at least one first OHT vehicle from the main system control module;
   moving the at least one first OHT vehicle to the at least one temporary wafer-receiving apparatus for loading the at least one first OHT vehicle with the third wafer carrier device from the at least one temporary wafer-receiving apparatus;
   moving the at least one first OHT vehicle to the at least one second wafer processing apparatus, for asking the OHT vehicle control module whether the third wafer carrier device can be unloaded onto the at least one second wafer processing apparatus from the at least one first OHT vehicle;
   informing the at least one first OHT vehicle by the OHT vehicle control module to stop unloading the third wafer carrier device onto the at least one second wafer processing apparatus from the at least one first OHT vehicle;
   issuing a surrounding command to the at least one first OHT vehicle from the OHT vehicle control module for continuously moving the at least one first OHT vehicle along the at least one surrounding handling track;
   moving the at least one second OHT vehicle to the at least one second wafer processing apparatus for loading the at least one second OHT vehicle with the second wafer carrier device from the at least one second wafer processing apparatus;
   moving the at least one first OHT vehicle to reach the at least one second wafer processing apparatus after finishing the surrounding command, for asking the OHT vehicle control module whether the third wafer carrier device can be unloaded onto the at least one second wafer processing apparatus from the at least one first OHT vehicle;
   informing the at least one first OHT vehicle by the OHT vehicle control module to unloading the third wafer carrier device onto the at least one second wafer processing apparatus from the at least one first OHT vehicle; and
   unloading the third wafer carrier device onto the at least one second wafer processing apparatus from the at least one first OHT vehicle.

2. The method of claim 1, wherein the at least one first wafer processing apparatus and the at least one second wafer processing apparatus are disposed under the at least one surrounding handling track.

3. The method of claim 1, wherein the at least one temporary wafer-receiving apparatus is disposed under the at least one surrounding handling track and between the at least one first wafer processing apparatus and the at least one second wafer processing apparatus.

4. The method of claim 1, wherein the at least one first OHT vehicle and the at least one second OHT vehicle are connected to the at least one surrounding handling track and are slidably disposed under the at least one surrounding handling track.

5. A method for operating an automatic handling system applied to many wafer processing apparatuses, comprising the steps of:
   providing at least one surrounding handling track, at least one first OHT (Overhead Hoist Transport) vehicle for carrying a first wafer carrier device, at least one second OHT vehicle, at least one first wafer processing apparatus, at least one second wafer processing apparatus for receiving a second wafer carrier device, at least one temporary wafer-receiving apparatus for receiving a third wafer carrier device, and a OHT vehicle control module for controlling the at least one first OHT vehicle and the at least one second OHT vehicle to move on the at least one surrounding handling track;

simultaneously issuing a first unloading command and a first loading command from a main system control module, for moving the at least one first OHT vehicle to the at least one first wafer processing apparatus and unloading the first wafer carrier device onto the at least one first wafer processing apparatus from the at least one first OHT vehicle;

issuing a second loading command and a second unloading command from the main system control module, for moving the at least one first OHT vehicle to the at least one temporary wafer-receiving apparatus and loading the at least one first OHT vehicle with the third wafer carrier device from the at least one temporary wafer-receiving apparatus;

moving the at least one first OHT vehicle to the at least one second wafer processing apparatus, for asking the OHT vehicle control module whether the third wafer carrier device can be unloaded onto the at least one second wafer processing apparatus from the at least one first OHT vehicle;

informing the at least one first OHT vehicle by the OHT vehicle control module to stop unloading the third wafer carrier device onto the at least one second wafer processing apparatus from the at least one first OHT vehicle;

issuing a surrounding command to the at least one first OHT vehicle from the OHT vehicle control module for continuously moving the at least one first OHT vehicle along the at least one surrounding handling track;

moving the at least one second OHT vehicle to the at least one second wafer processing apparatus for loading the at least one second OHT vehicle with the second wafer carrier device from the at least one second wafer processing apparatus;

moving the at least one first OHT vehicle to reach the at least one second wafer processing apparatus after finishing the surrounding command, for asking the OUT vehicle control module whether the third wafer carrier device can be unloaded onto the at least one second wafer processing apparatus from the at least one first OHT vehicle;

informing the at least one first OHT vehicle by the OHT vehicle control module to unloading the third wafer carrier device onto the at least one second wafer processing apparatus from the at least one first OHT vehicle; and unloading the third wafer carrier device onto the at least one second wafer processing apparatus from the at least one first OHT vehicle.

6. The method of claim 5, wherein the at least one first wafer processing apparatus and the at least one second wafer processing apparatus are disposed under the at least one surrounding handling track.

7. The method of claim 5, wherein the at least one temporary wafer-receiving apparatus is disposed under the at least one surrounding handling track and between the at least one first wafer processing apparatus and the at least one second wafer processing apparatus.

8. The method of claim 5, wherein the at least one first OHT vehicle and the at least one second OHT vehicle are connected to the at least one surrounding handling track and are slidably disposed under the at least one surrounding handling track.

* * * * *